United States Patent
Tsai et al.

(10) Patent No.: US 9,934,969 B2
(45) Date of Patent: Apr. 3, 2018

(54) CHARGED-PARTICLE-BEAM PATTERNING WITHOUT RESIST

(71) Applicants: Taiwan Semiconductor Manufacturing Company, Ltd., Hsin-Chu (TW); National Taiwan University, Taipei (TW)

(72) Inventors: Kuen-Yu Tsai, Taipei (TW); Miin-Jang Chen, Taipei (TW); Samuel C. Pan, Hsin-Chu (TW)

(73) Assignees: Taiwan Semiconductor Manufacturing Company, Ltd., Hsin-Chu (TW); National Taiwan University, Taipei (TW)

( * ) Notice: Subject to any disclaimer, the term of this patent is extended or adjusted under 35 U.S.C. 154(b) by 276 days.

(21) Appl. No.: 14/304,691

(22) Filed: Jun. 13, 2014

(65) Prior Publication Data

US 2015/0221514 A1 Aug. 6, 2015

Related U.S. Application Data

(60) Provisional application No. 61/934,418, filed on Jan. 31, 2014.

(51) Int. Cl.
*H01L 21/033* (2006.01)
*H01L 21/02* (2006.01)
*C23C 16/04* (2006.01)

(52) U.S. Cl.
CPC ........ *H01L 21/0337* (2013.01); *C23C 16/047* (2013.01); *H01L 21/0228* (2013.01);
(Continued)

(58) Field of Classification Search
CPC ............. H01L 21/0337; H01L 21/0332; H01L 21/0228; H01L 21/02225; H01L 21/02351;
(Continued)

(56) References Cited

U.S. PATENT DOCUMENTS 7,196,005 B2 * 3/2007 Ho ..................... H01L 21/31144
257/E21.036
8,093,144 B2 * 1/2012 Jacobson ............... B82Y 10/00
257/E21.16
(Continued)

FOREIGN PATENT DOCUMENTS

CN 101034254 A 9/2007
CN 101965626 A 2/2011
(Continued)

OTHER PUBLICATIONS

Emile van der Drift et al., "Helium Ion Lithography Principles and Performance", in Nanofabrication Techniques and Principles, 2012 Springer-Verlag, Chapter 4, pp. 93-116.
(Continued)

*Primary Examiner* — Michael Trinh
(74) *Attorney, Agent, or Firm* — Slater Matsil, LLP

(57) ABSTRACT

A process for fabricating an integrated circuit is provided. The process includes providing a substrate, forming a hard mask upon the substrate by one of atomic-layer deposition and molecular-layer deposition, and exposing the hard mask to a charged particle from one or more charged particle beams to pattern a gap in the hard mask. In the alternative, the process includes exposing the hard mask to a charged particle from one or more charged-particle beams to pattern a structure on the hard mask.

20 Claims, 5 Drawing Sheets

(52) U.S. Cl.
CPC .. *H01L 21/02225* (2013.01); *H01L 21/02351* (2013.01); *H01L 21/0332* (2013.01)

(58) Field of Classification Search
CPC ............ C23C 16/047; C23C 16/45525; C23C 14/048; B82Y 40/00
See application file for complete search history.

(56) References Cited

U.S. PATENT DOCUMENTS

| | | | |
|---|---|---|---|
| 8,153,348 | B2 | 4/2012 | Nemani et al. |
| 8,216,948 | B2 | 7/2012 | Moon |
| 8,841,048 | B2 * | 9/2014 | Inazuki ............... G03F 1/14 430/5 |
| 8,932,955 | B1 | 1/2015 | Sel et al. |
| 8,946,000 | B2 * | 2/2015 | Reber ............... H01L 23/5258 257/529 |
| 9,570,301 | B2 * | 2/2017 | Tsai ................... H01L 21/0274 |
| 2007/0158558 | A1 | 7/2007 | Ward et al. |
| 2007/0212648 | A1 | 9/2007 | Lalbahadoersing et al. |
| 2009/0286185 | A1 | 11/2009 | Bae |
| 2011/0147783 | A1 | 6/2011 | Chang |
| 2012/0207944 | A1 * | 8/2012 | Finch ............... C23C 16/45536 427/526 |
| 2013/0260557 | A1 * | 10/2013 | Wang ............... H01L 21/0337 438/669 |

FOREIGN PATENT DOCUMENTS

| | | | |
|---|---|---|---|
| KR | 20080078026 | A | 8/2008 |
| KR | 20110004884 | A | 1/2011 |
| TW | 201220502 | A1 | 5/2012 |

OTHER PUBLICATIONS

Hollenbeck, "Oxide thin films for nanometer scale electron beam lithography",J. Mater. Res., vol. 5, No. 5, May 5, 1990, pp. 1058-1072.

Chen et al., "A Novel Nanoinjection Lithography (NInL) Technology and Its Application for 16-nm Node Device Fabrication", IEEE Transactions on Electron Devices, vol. 58, No. 11, Nov. 2011, pp. 3678-3686.

Wanzenboeck, H.D., et al., "Focused Ion Beam Lithography," Vienna University of Technology—Institute for Solid State Electronics, 2011, 25 pages, Austria.

Barkusky, F. et al., "Direct photo-etching of poly(methyl methacrylate) using focused extreme ultraviolet radiation from a table-top laser-induced plasma source," Journal of Appled Physics 101,2007, 6 pages.

Chen, H.Y., et al., "A Novel Nanoinjection Lithography (NInL) Technology and Its Application for 16-nm Node Device Fabrication," IEEE Transactions on Electron Devices, vol. 58, No. 11, Nov. 2011, pp. 3678-3686, 9 pages.

Dorp, et al., "A critical literature review of focused electron beam induced deposition", Journal of Applied Physics 104, 081301, 2008, 43 pages.

Ma, et al., "X-ray induced, substrate-carrier mediated deposition of metal on GaAs," Applied Physics Letters 89 (2006); 4 pages.

Streller, U. et al., "Photon-induced dry etching of Si(I00) in the VUV," Applied Surface Science 96-98 (1996), pp. 448-452 (5 pages).

Sun, Y., et al., "Effects of visible and synchrotron x-ray radiation on the growth of silver nanoplates on n-Ga As wafers: A comparative study," Applied Physics Letters 92, 2008, 4 pages.

* cited by examiner

CHARGED-PARTICLE-BEAM PATTERNING WITHOUT RESIST

CROSS-REFERENCE TO RELATED APPLICATIONS

This application claims the benefit of U.S. Provisional Application No. 61/934,418, filed on Jan. 31, 2014, entitled "Charged-Particle-Beam Patterning Without Resist," which application is hereby incorporated herein by reference.

BACKGROUND

Charged-particle lithography, such as ion- or electron-projection lithography, is capable of very-high-resolution patterning. Ion beam lithography uses a focused or broad beam of energetic lightweight ions for transferring pattern to a surface. Using Ion Beam Lithography (IBL) nano-scale features can be transferred on non-planar surfaces.

In conventional charged-particle (e.g., electron, and ions such as helium, $He^+$, neon, $Ne^+$, and gallium, $Ga^+$) lithography, the fundamental process mechanism involves using bond dissociation in positive resist or bond association in negative resist and resultant dissolution rate differences between the exposed and unexposed areas when developing the resist. This limits the selection of the resist materials, which are mostly polymer-based organic materials.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
FIGS. 1-3 illustrate a method of forming an integrated circuit using direct-write nano patterning in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The fabrication of an integrated circuit (IC) often involves performing a variety of physical and chemical processes on a semiconductor substrate. In general, the various processes used to make an integrated circuit fall into three categories, namely film deposition, semiconductor doping, and patterning.

In the present disclosure, novel nano patterning techniques are provided. As will be more fully explained below, charged particles are used in combination with a hard mask formed by an atomic layer deposition (ALD) process or a molecular layer deposition (MLD) process to inhibit or prevent an undesirable collapse or deformation of the hard mask when nano gaps are formed therein or nano structures are formed thereon. In addition, the nano patterning techniques disclosed herein eliminate the need for a resist.

Keeping the above in mind, novel nano patterning methods used to form an integrated circuit are described in detail below. As will be more fully explained below, a beam carrying charged particles may be used to form a gap in a hard mask or, in the alternative, to form a structure upon the hard mask.

In a first embodiment, charged particles are used to etch a hard mask. Referring now to FIG. 1, a substrate 12 is provided. In an embodiment, the substrate 12 may be made of a semiconductor material such as silicon, bulk silicon (doped or undoped), germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 12 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. Other substrates that may be used include multi-layered substrates, gradient substrates, or hybrid orientation substrates.

Still referring to FIG. 1, a hard mask 10 is deposited on the substrate 12 using an ALD or MLD process, which offers numerous benefits. For example, ALD and MLD provide extreme thickness resolution, accurate thickness control with one monolayer accuracy, conformal step coverage, and excellent uniformity. In addition, a film thickness can be determined precisely by the number of applied ALD or MLD cycles. Accordingly, a critical dimension (CD) of a gap or trench can be adjusted precisely.

In addition, ALD and MLD allow for high conformality and excellent step coverage on high-aspect-ratio structures. Further, ALD and MLD permit excellent uniformity over a large area, which leads to large-area and large-batch capacity. The ALD and MLD processes also give accurate composition control, low defect density, good reproducibility, and a wider choice of materials (e.g., non-polymer-based) because the exposure mechanism in the conventional photoresist material is not required.

In addition, a hard mask 10 formed using either the ALD process or the MLD process is much harder than, for example, the photoresist used in photolithography processes. Because the hard mask 10 is harder than a photoresist, the hard mask 10 is less likely to undesirably collapse or deform when either gaps are formed therein or structures are formed thereon, as will be more fully explained below.

Other formation processes providing a hard mask 10 having the benefits, properties, and characteristics noted above may also be used.

In an embodiment, the hard mask 10 is prepared by an ALD or an MLD process and formed from $Al_2O_3$, AlN, AlP, AlAs, $Al_xTi_yO_z$, $Al_xCr_yO_z$, $Al_xZr_yO_z$, $Al_xHf_yO_z$, $Al_xSi_yO_z$, $B_2O_3$, BN, $B_xP_yO_z$, $BiO_x$, $Bi_xTi_yO_z$, BaS, $BaTiO_3$, CdS, CdSe, CdTe, CaO, CaS, $CaF_2$, $CuGaS_2$, CoO, $CoO_x$, $Co_3O_4$, $CrO_x$, $CeO_2$, $Cu_2O$, CuO, $Cu_xS$, FeO, $FeO_x$, GaN, GaAs, GaP, $Ga_2O_3$, $GeO_2$, $HfO_2$, $Hf_3N_4$, HgTe, InP, InAs, $In_2O_3$, $In_2S_3$, InN, InSb, $LaAlO_3$, $La_2S_3$, $La_2O_2S$, $La_2O_3$, $La_2CoO_3$, $La_2NiO_3$, $La_2MnO_3$, MgTe, MnTe, MoN, $Mo_2N$, $Mo_xN$, $MoO_2$, MgO, $MnO_x$, MnS, NiO, NbN, $Nb_2O_5$, PbS, $PtO_2$, $PD_x$, $P_xB_yO_z$, RuO, $Sc_2O_3$, $Si_3N_4$, $SiO_2$, SiC, $Si_xTi_yO_z$, $Si_xZr_yO_z$, $Si_xHf_yO_z$, $SnO_2$, $Sb_2O_5$, SrO, $SrCO_3$, $SrTiO_3$, SrS, $SrS_{1-x}Se_x$, $SrF_2$, $Ta_2O_5$, $TaO_xN_y$, $Ta_3N_5$, TaN, $TaN_x$, $Ti_xZr_yO_z$, $TiO_2$, TiN, $Ti_xSi_yN_z$, $Ti_xHf_yO_z$, $VO_x$, $WO_3$, $W_2N$, $W_xN$, $WS_2$, $W_xC$, $Y_2O_3$, $Y_2O_2S$, $ZnS_{1-x}Se_x$, ZnO, ZnS, ZnSe, ZnTe, $ZnF_2$, $ZrO_2$, $Zr_3N_4$, $PrO_x$, $Nd_2O_3$, $Sm_2O_3$, $Eu_2O_3$, $Gd_2O_3$, $Dy_2O_3$, $Ho_2O_3$, $Er_2O_3$, $Tm_2O_3$, $Lu_2O_3$, Ru, Pt, Pd, Rh, Ag, Al, Ir, Cu, Ti, Ta, Mo, W, Ni, Co, Fe, and a mixture therebetween.

Figure 2:
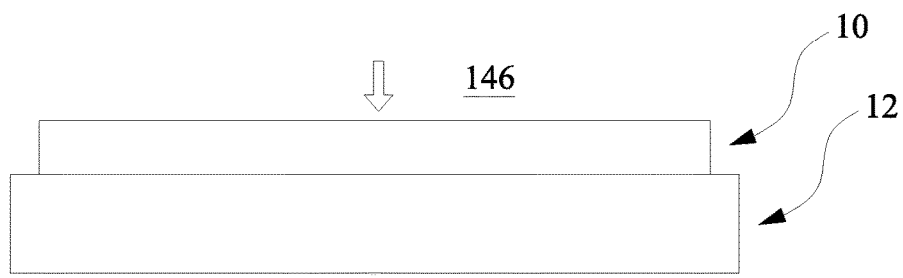

Referring now to FIG. 2, a precursor gas 146 is provided. In accordance with some embodiments, the precursor gas 146 is flowed over at least the hard mask 10. In accordance with some embodiments, the precursor gas 146 is, for example, $XeF_2$. Other suitable precursors may also be employed such as $SF_6$, nitrosyl chloride (NOCl), chlorine ($Cl_2$), chlorine trifluoride ($ClF_3$), oxygen ($O_2$), water ($H_2O$), air, and a mixture therebetween.

In addition, the hard mask 10 is exposed to the charged particles carried by a charged particle beam (represented by the arrows). In accordance with some embodiments, the charged particles may be, for example, an electron, a proton, helium, neon, argon, silicon, beryllium, gold, and gallium. In other words, the charged-particle beam of FIG. 2 may be an electron beam, a proton beam, a helium beam, a neon beam, an argon beam, a silicon beam, a beryllium beam, a gold beam, and a gallium beam. In accordance with some embodiments, one or more of the charged-particle beams has a beam diameter of less than one nanometer (1 nm). While a single charged-particle beam is depicted in FIG. 2, it should be recognized that several of the charged-particle beams may be used in combination or simultaneously in some embodiments.

Figure 3:
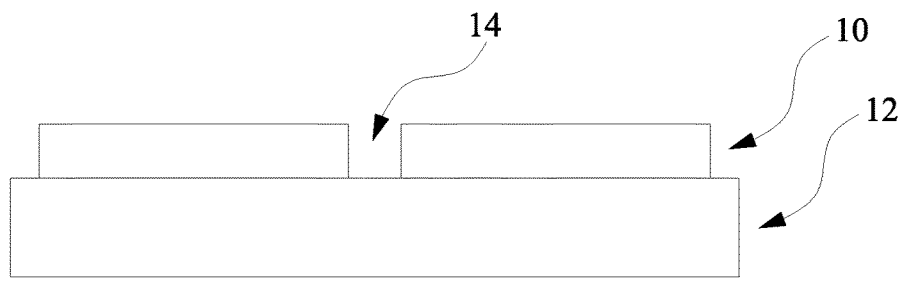

Referring to FIGS. 2-3, the charged particles from the charged-particle beam encounter molecules from the precursor gas 146 that have absorbed on the hard mask 10. Under the influence of the charged-particle beam, precursor molecules are dissociated into volatile and non-volatile components. The volatile components etch the hard mask 10 only locally at or around the area subjected to the charged particles to form the gap 14.

In accordance with some embodiments, a depth of the gap 14 is greater than or equal to about fifty percent (50%) of the thickness of the hard mask 10. In an embodiment, the thickness of the hard mask 10 is less than about five nanometers (5 nm). While a single gap 14 is depicted in FIG. 3, it should be recognized that several of the gaps 14 may be formed in practical applications.

Because the hard mask 10 formed by ALD or MLD is harder than a photoresist, the hard mask 10 is less likely to undesirably collapse or deform when the gaps 14 are formed. For example, the hard mask 10 will not undesirably collapse or deform when several of the gaps 14 are formed close to each other, the depth of the gaps 14 is large (e.g., about 10 nm), the width of the gaps 14 is small (e.g., about 1 nm), or the aspect ratio (i.e., the ratio of the depth to width of the gap 14) is high (e.g., about 10 to 1).

After the gap 14 has been formed, other various processes may be performed. For example, a pattern transfer (e.g., etching, deposition/lift off) or implantation may take place during fabrication of the integrated circuit. In accordance with some embodiments, the pattern transfer process is applied using an etching process upon the substrate 12. For example, a wet etch or a plasma etch may be performed to transfer the pattern of the gap 14 into the substrate 12. In accordance with some embodiments, the pattern transfer process incorporates an ion implantation process. For example, impurities (e.g., p-doping with Boron, Indium, etc., or n-doping with Phosphorus, Arsenic, etc.) may be implanted into the substrate 12 through the gap 14.

In a second embodiment, charged particles are used to sputter (e.g., mill) the hard mask 10 to form the gap 14. In this sputtering embodiment, many of the techniques described above in connection with etching using charged particles are the same. However, when sputtering the hard mask 10 with charged particles the precursor gas 146 described above with reference to FIG. 2 is unneeded. Instead of relying on the precursor gas 146, the energy of the charged particles is used to mill the surface of the hard mask 10 to form the gap 14 shown in FIG. 3.

Figure 4:
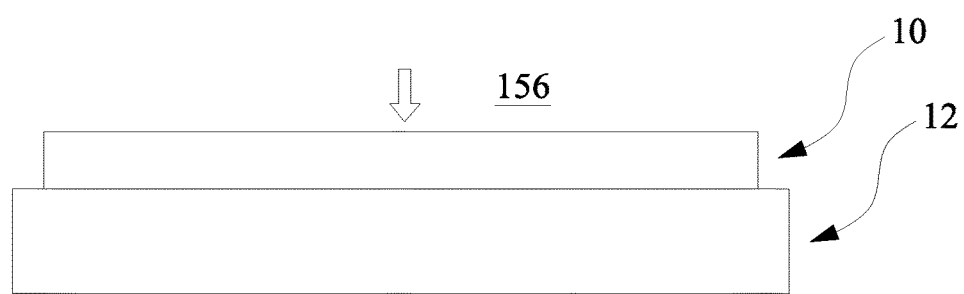
FIGS. 4-5 illustrate another method of forming an integrated circuit using direct-write nano patterning in accordance with some embodiments.
Figure 5:
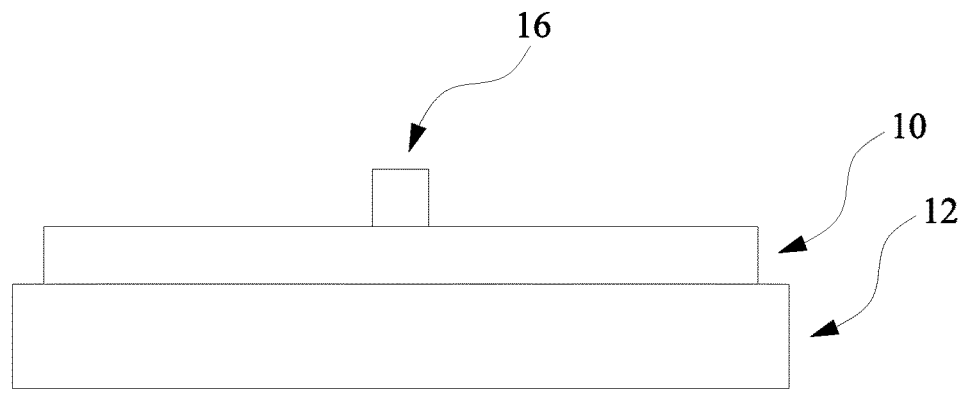

In a third embodiment, charged particles are used to deposit material on the hard mask 10 to form the structure 16 as shown in FIGS. 4-5. In this deposition embodiment, many of the techniques described above in connection with etching are the same. However, when forming the structure 16 with charged particles the precursor gas 156 is different than with etching. In accordance with some embodiments, the precursor gas 156 may be TEOS, Styrene, TMCTS, Naphthalene, Al, Au, amorphous carbon, diamond, Co, Cr, Cu, Fe, GaAs, GaN, Ge, Mo, Nb, Ni, Os, Pd, $CpPtMe_3$, $MeCpPtMe_3$, a compound containing Pt (e.g., $Pt(PF_3)_4$), Rh, Ru, Re, Si, $Si_3N_4$, SiOx, TiOx, W, and a mixture therebetween to form structure 16.

The charged particles encounter molecules from the precursor gas 156 that have absorbed on the hard mask 10. Under the influence of the charged particles, the precursor molecules are dissociated into volatile and non-volatile components. The volatile components adhere to the hard mask 10 only locally at or around the area subjected to the charged particles to form the structure 16. In accordance with some embodiments, the structure 16 is a top hard mask formed from, for example, platinum, Pt, Cobalt, Co, silicon dioxide, $SiO_2$.

Figure 6:
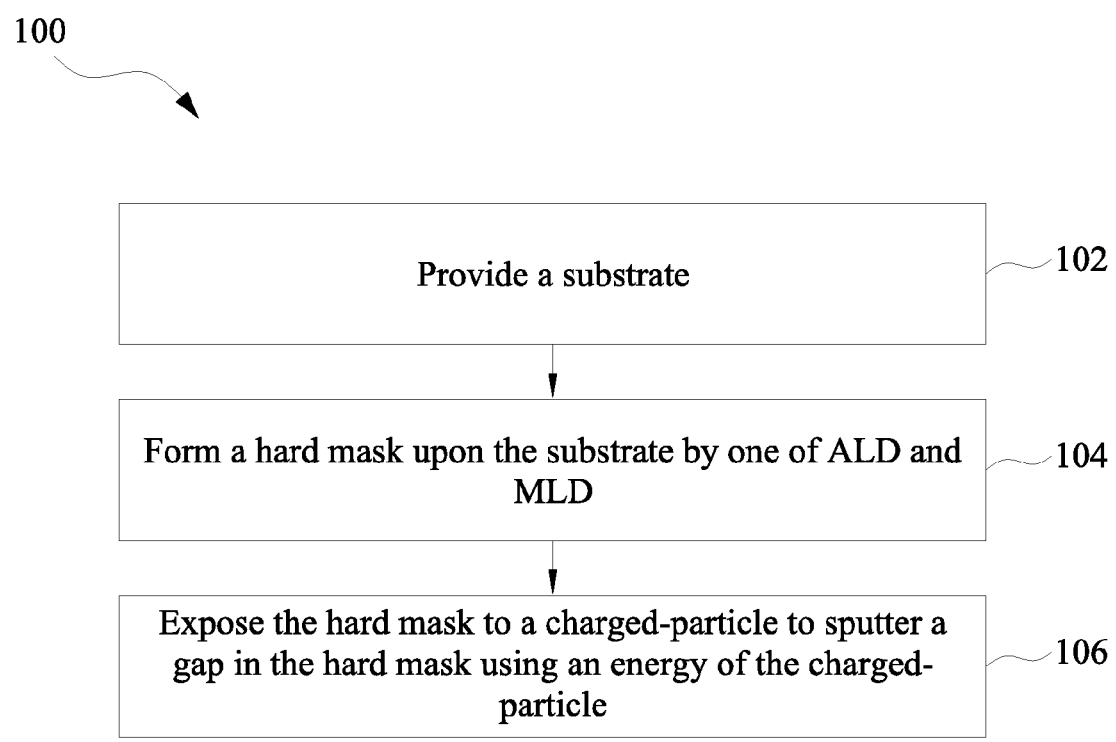
FIG. 6 is a process for fabricating an integrated circuit in accordance with some embodiments.

Referring now to FIG. 6, a process 100 for forming an integrated circuit is provided in accordance with some embodiments. In block 102, a substrate 12 is provided. In block 104, a hard mask 10 is formed on the substrate 12 by one of atomic-layer deposition and molecular-layer deposition. In block 106, the hard mask 10 is exposed to a charged particle to sputter a gap 14 in the hard mask 10 using an energy of the charged particle.

Figure 7:
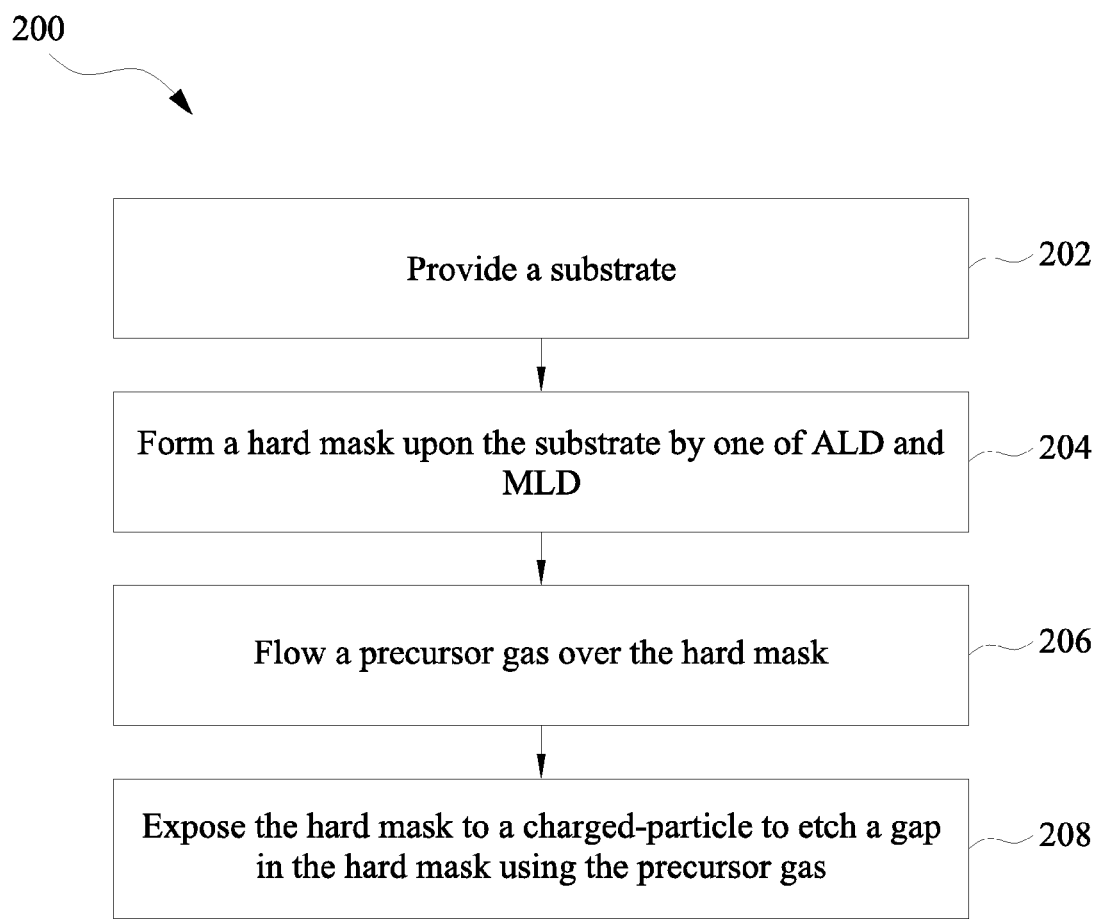
FIG. 7 is a process for fabricating an integrated circuit in accordance with some embodiments.

Referring now to FIG. 7, a process 200 for forming an integrated circuit is provided. In block 202, a substrate 12 is provided. In block 204, a hard mask 10 is formed on the substrate 12 by one of atomic-layer deposition and molecular-layer deposition. In block 206, a precursor gas 146 is flowed over the hard mask 10. In block 208, the hard mask 10 is exposed to a charged particle to etch a gap 14 in the hard mask 10 using the precursor gas 146.

Figure 8:
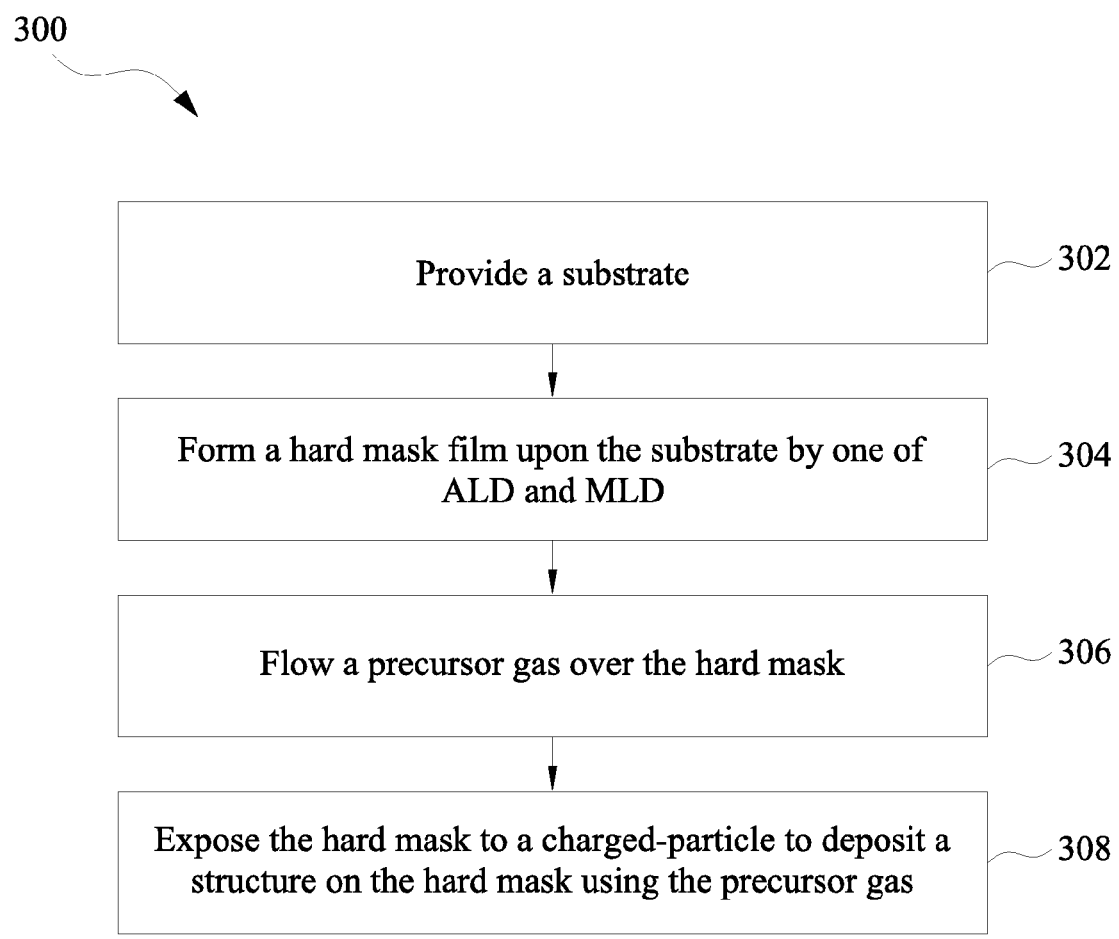
FIG. 8 is a process for fabricating an integrated circuit in accordance with some embodiments.

Referring now to FIG. 8, a process 300 for forming an integrated circuit is provided. In block 302, a substrate 12 is provided. In block 304, a hard mask 10 is formed on the substrate 12 by one of atomic-layer deposition and molecular-layer deposition. In block 306, a precursor gas 156 is flowed over the hard mask 10. In block 308, the hard mask 10 is exposed to a charged particle to deposit a structure 16 on the hard mask 10 using the precursor gas 156.

From the foregoing, it should be recognized that the nano patterning methods utilize (1) charged-particle beam induced etching; (2) charged-particle beam milling; or (3) charged-particle beam induced deposition along with atomic layer deposition (ALD) or molecular layer deposition (MLD) to eliminate the need for a resist. Because the hard mask 10 formed by ALD or MLD is harder than a photoresist, the hard mask 10 is less likely to undesirably collapse or deform. For example, the hard mask 10 will not undesirably collapse or deform when several of the gaps 14 are formed close to each other, the depth of the gaps 14 is large (e.g., 10 nm), the width of the gaps 14 is small (e.g., 1 nm), or the aspect ratio (i.e., the ratio of the depth to width of the gap 14) is high (e.g., 10 to 1). In addition, the methods may be used to avoid the effects of forward and backward scattering within a resist. Further, with the methods disclosed herein there is no longer a need to develop the resist. As such, resist collapse for patterns with high aspect ratios is no longer an issue.

A process for fabricating an integrated circuit in accordance with some embodiments is provided. The process includes providing a substrate, forming a hard mask upon the substrate by one of atomic-layer deposition and molecular-layer deposition, and exposing the hard mask to a charged particle from one or more charged particle beams to pattern a gap in the hard mask.

A process for fabricating an integrated circuit in accordance with some embodiments is provided. The process includes providing a substrate, forming a hard mask upon the substrate by one of atomic-layer deposition and molecular-layer deposition, and directing on or more charged-particle beams at the hard mask to pattern the hard mask.

A process for fabricating an integrated circuit in accordance with some embodiments is provided. The process includes providing a substrate, forming a hard mask on the substrate by one of atomic-layer deposition and molecular-layer deposition, flowing a precursor gas over an entire surface of the hard mask, and exposing a portion of the hard mask to one or more charged-particle beams carrying a charged particle, the charged particle patterning the hard mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A process for fabricating an integrated circuit, comprising:
    forming a hard mask upon a substrate by one of atomic-layer deposition and molecular-layer deposition;
    flowing a precursor gas over the hard mask; and
    after flowing the precursor gas over the hard mask, exposing the hard mask and the precursor gas to a charged particle from one or more charged-particle beams, wherein the charged particle and the precursor gas deposit a structure on the hard mask, wherein molecules of the precursor gas absorbed on the hard mask are dissociated into volatile and non-volatile components under the influence of the one or more charged-particle beams, wherein the volatile components of the precursor gas adhere to the hard mask in an area exposed to the charged particle, and wherein an entirety of a bottommost surface of the structure is in physical contact with a material of the hard mask.

2. The process of claim 1, wherein the charged particle is one of helium, neon, argon, silicon, beryllium, gold, and gallium.

3. The process of claim 1, wherein a thickness of the hard mask is less than about five nanometers.

4. The process of claim 1, wherein the one or more charged-particle beams have a beam diameter of less than about one nanometer.

5. The process of claim 1, wherein the precursor gas contains one of TEOS, Styrene, TMCTS, Naphthalene, Al, Au, amorphous carbon, diamond, Co, Cr, Cu, Fe, GaAs, GaN, Ge, Mo, Nb, Ni, Os, Pd, $CpPtMe_3$, $MeCpPtMe_3$, a compound containing Pt, Rh, Ru, Re, Si, $Si_3N_4$, SiOx, TiOx, W, and a combination thereof.

6. The process of claim 1, wherein the structure is deposited over a portion of the hard mask exposed to the one or more charged-particle beams.

7. The process of claim 1, wherein the structure forms an additional hard mask over the hard mask.

8. A process for fabricating an integrated circuit, comprising:
    forming a first hard mask upon a semiconductor substrate by one of atomic-layer deposition and molecular-layer deposition;
    flowing a precursor gas over an entire surface of the first hard mask; and
    after flowing the precursor gas over the entire surface of the first hard mask, directing one or more charged-particle beams at the first hard mask to pattern the first hard mask, wherein the precursor gas undergoes a dissociation reaction into volatile and non-volatile components under the influence of the one or more charged-particle beams and forms a second hard mask on the first hard mask, wherein the volatile components adhere to the first hard mask in an area to which the charged-particle beams are directed to form the second hard mask, wherein the second hard mask is in physical contact with the first hard mask, and wherein an interface between the first hard mask and the second hard mask is at least as wide as the second hard mask.

9. The process of claim 8, wherein the one or more charged-particle beams comprises helium, neon, argon, silicon, beryllium, gold, or gallium.

10. The process of claim 8, wherein the one or more charged-particle beams have a beam diameter of less than about one nanometer.

11. The process of claim 8, wherein the first hard mask is in physical contact with the semiconductor substrate, and wherein a thickness of the first hard mask is less than about five nanometers.

12. The process of claim 8, wherein the precursor gas contains one of TEOS, Styrene, TMCTS, Naphthalene, Al, Au, amorphous carbon, diamond, Co, Cr, Cu, Fe, GaAs, GaN, Ge, Mo, Nb, Ni, Os, Pd, $CpPtMe_3$, $MeCpPtMe_3$, a compound containing Pt, Rh, Ru, Re, Si, $Si_3N_4$, SiOx, TiOx, W, and a combination thereof.

13. The process of claim 8, wherein the second hard mask is formed of Pt, Co, or $SiO_2$.

14. The process of claim 8, wherein the second hard mask is formed over a portion of the first hard mask exposed to the one or more charged-particle beams.

15. A process for fabricating an integrated circuit, comprising:
    forming a hard mask on a substrate by one of atomic-layer deposition and molecular-layer deposition, the hard mask having a first sidewall and a second sidewall opposite the first sidewall, wherein a continuous material of the hard mask extends between the first sidewall and the second sidewall;
    flowing a precursor gas over an entire surface of the hard mask; and
    after flowing the precursor gas over the entire surface of the hard mask, exposing a portion of the hard mask to one or more charged-particle beams carrying a charged particle, the charged particle patterning the hard mask, wherein the charged particle causes the precursor gas to dissociate into volatile components and non-volatile components, wherein the volatile components adhere to the portion of the hard mask exposed to the one or more charged-particle beams, wherein the charged particle and the precursor gas deposit a structure on the portion of the hard mask, wherein the structure is fully formed immediately after exposing the hard mask to the one or more charged-particle beams, wherein the structure is in physical contact with the continuous material of the hard mask, wherein at least one sidewall of the structure is interposed between the first sidewall and the second sidewall of the hard mask, and wherein at least a portion of a top surface of the continuous material of the hard mask remains exposed after depositing the structure on the hard mask.

16. The process of claim 15, wherein the charged particle is one of helium, neon, argon, silicon, beryllium, gold, and gallium.

17. The process of claim 15, wherein the precursor gas contains one of TEOS, Styrene, TMCTS, Naphthalene, Al, Au, amorphous carbon, diamond, Co, Cr, Cu, Fe, GaAs, GaN, Ge, Mo, Nb, Ni, Os, Pd, $CpPtMe_3$, $MeCpPtMe_3$, a compound containing Pt, Rh, Ru, Re, Si, $Si_3N_4$, SiOx, TiOx, W, and a combination thereof.

18. The process of claim 15, wherein the structure forms an additional hard mask over the hard mask.

19. The process of claim 15, wherein the one or more charged-particle beams have a beam diameter of less than about one nanometer.

20. The process of claim 15, wherein the hard mask is in physical contact with the substrate, and wherein a thickness of the hard mask is less than about five nanometers.

\* \* \* \* \*